ios009865529B2

United States Patent
Sato

(10) Patent No.: US 9,865,529 B2
(45) Date of Patent: Jan. 9, 2018

(54) SEMICONDUCTOR MODULE WITH CONDUCTIVE PIN

(71) Applicant: FUJI ELECTRIC CO., LTD., Kawasaki-shi, Kanagawa (JP)

(72) Inventor: Tadahiko Sato, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/200,746

(22) Filed: Jul. 1, 2016

(65) Prior Publication Data

US 2016/0315038 A1    Oct. 27, 2016

Related U.S. Application Data

(63) Continuation of application No. PCT/JP2015/065607, filed on May 29, 2015.

(30) Foreign Application Priority Data

Jul. 30, 2014 (JP) .................. 2014-154626

(51) Int. Cl.
  *H01L 23/495* (2006.01)
  *H01L 25/00* (2006.01)
  (Continued)

(52) U.S. Cl.
  CPC ........ *H01L 23/49568* (2013.01); *H01L 23/08* (2013.01); *H01L 23/367* (2013.01); *H01L 23/3736* (2013.01); *H01L 23/4952* (2013.01); *H01L 23/49506* (2013.01); *H01L 23/49524* (2013.01); *H01L 23/49575* (2013.01); *H01L 23/49589* (2013.01); *H01L 25/00* (2013.01);
  (Continued)

(58) Field of Classification Search
  CPC .......... H01L 23/4952; H01L 23/49524; H01L 23/49568; H01L 23/49575; H01L 23/49589; H01L 25/00; H01L 25/07; H01L 25/18; H01L 2224/0603; H01L 2224/45144; H01L 2224/48137
  USPC ............... 257/300, 307, 516, 666, 675, 720; 438/122, 123, 171, 190
  See application file for complete search history.

(56) References Cited

U.S. PATENT DOCUMENTS

2008/0080141 A1 * 4/2008 Krokoszinski ....... H05K 3/0061
                                                              361/709
2009/0291531 A1 * 11/2009 Sato .................... H01L 21/4878
                                                              438/126
(Continued)

FOREIGN PATENT DOCUMENTS

JP           4-70957 U      6/1992
JP           06-034295 U    5/1994
(Continued)

*Primary Examiner* — Shahed Ahmed
(74) *Attorney, Agent, or Firm* — Rabin & Berdo, P.C.

(57) ABSTRACT

A semiconductor module including a circuit block that has an electrically insulating layer, a plurality of circuit patterns formed on one surface of the electrically insulating layer, and a plurality of power semiconductors mounted on the circuit patterns. The semiconductor module further includes a heat spreader formed on the other surface of the electrically insulating layer, and a capacitor having two electrodes, one of which is electrically connected to at least one of the circuit patterns, and the other of which is electrically connected to the heat spreader.

19 Claims, 15 Drawing Sheets

(51) Int. Cl.
   *H01L 25/07*     (2006.01)
   *H01L 25/18*     (2006.01)
   *H02M 7/48*      (2007.01)
   *H02M 7/00*      (2006.01)
   *H01L 23/08*     (2006.01)
   *H01L 23/367*    (2006.01)
   *H01L 23/373*    (2006.01)
   *H02M 7/5387*    (2007.01)

(52) U.S. Cl.
   CPC .............. *H01L 25/07* (2013.01); *H01L 25/18* (2013.01); *H02M 7/003* (2013.01); *H02M 7/48* (2013.01); *H01L 2224/0603* (2013.01); *H01L 2224/45144* (2013.01); *H01L 2224/48137* (2013.01); *H01L 2224/48139* (2013.01); *H01L 2224/4903* (2013.01); *H01L 2924/181* (2013.01); *H01L 2924/19107* (2013.01); *H01L 2924/3511* (2013.01); *H02M 7/5387* (2013.01)

(56) References Cited

U.S. PATENT DOCUMENTS

2010/0188059 A1*  7/2010  Takano ................ H01L 23/142
                                               323/234
2014/0374889 A1   12/2014  Denta et al.

FOREIGN PATENT DOCUMENTS

| JP | 10-270612 A   | 10/1998 |
| JP | 2002-171768 A | 6/2002  |
| JP | 2008-206314 A | 9/2008  |
| JP | 2009-010143 A | 1/2009  |
| JP | 2013-258321 A | 12/2013 |
| JP | 2014-038982 A | 2/2014  |

* cited by examiner

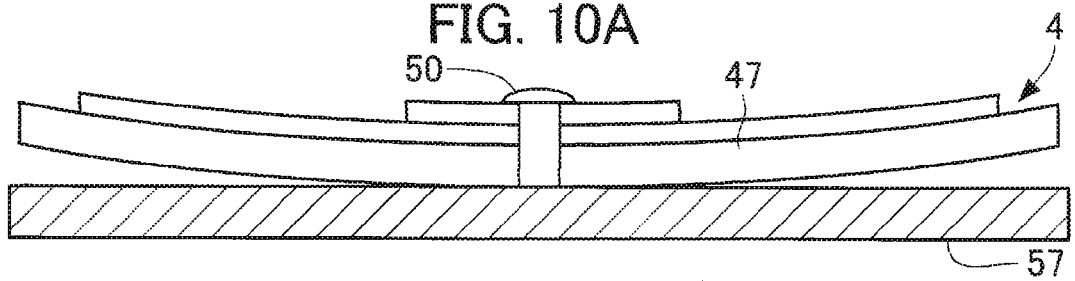
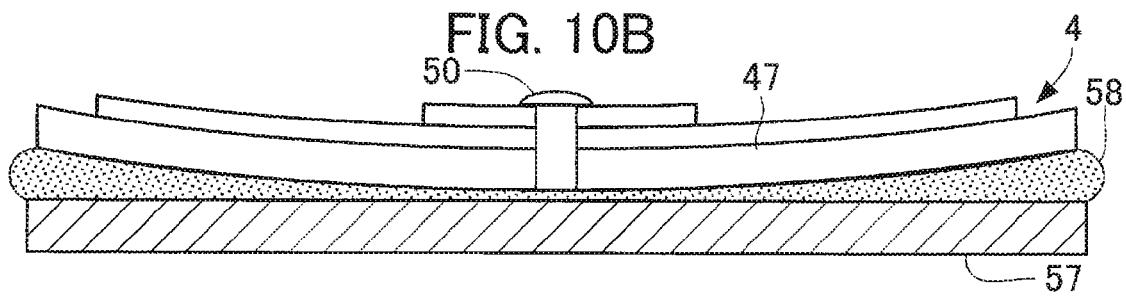
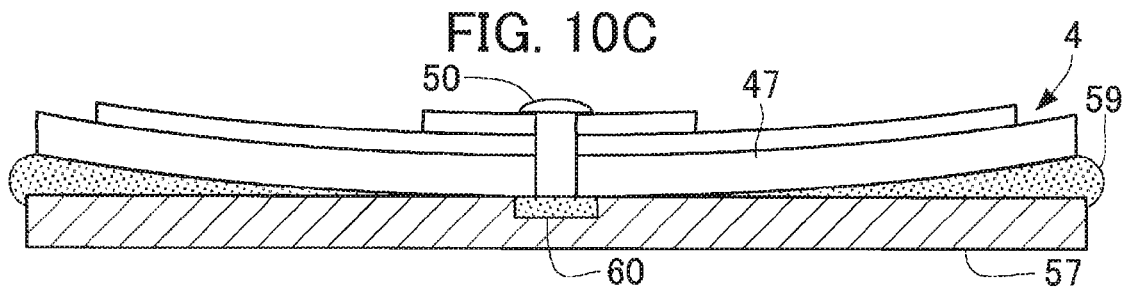
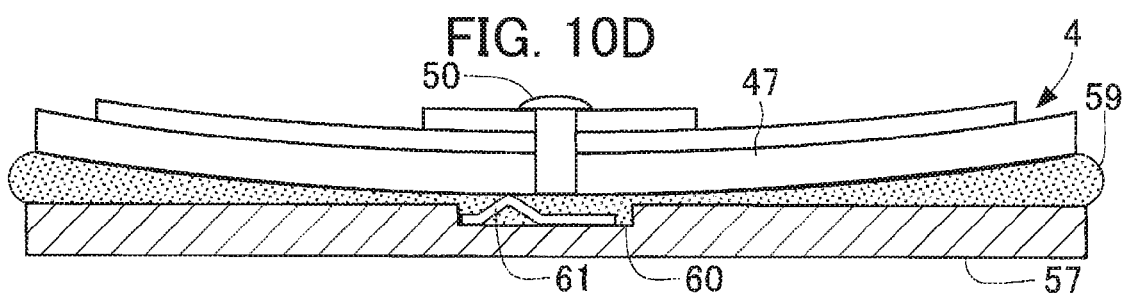
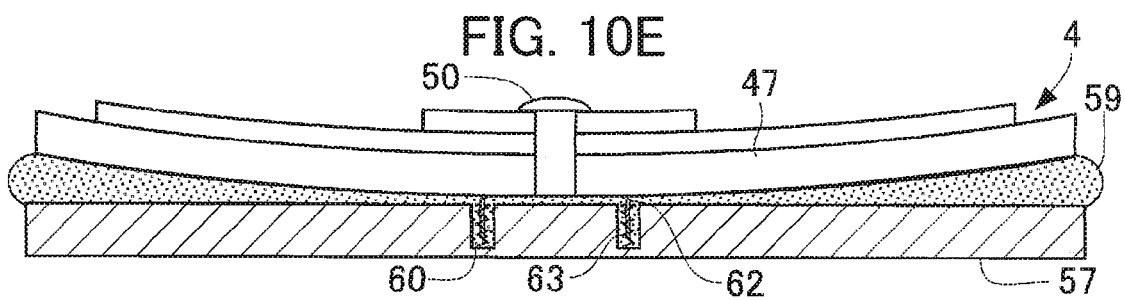

SEMICONDUCTOR MODULE WITH CONDUCTIVE PIN

CROSS-REFERENCE TO RELATED APPLICATION

This application is a continuation application of International Application PCT/JP2015/065607, filed on May 29, 2015, and designated the U.S., which claims priority to Japanese Patent Application No. 2014-154626, filed on Jul. 30, 2014, the entire contents of which are incorporated herein by reference.

BACKGROUND OF THE INVENTION

1. Field of the Invention

The present invention relates to a semiconductor module, and particularly relates to a semiconductor module (power module) used for a power conversion device such as an inverter device for driving a motor, a direct current (DC)-DC converter device, and the like.

2. Background of the Related Art

In a semiconductor module used for a power conversion device, a plurality of power semiconductor chips for power conversion are integrated into one package, and circuit wiring suitable to a desired application is formed in the package, which contributes to reducing the overall size of the application device. As a semiconductor module, there is known an IPM (Intelligent Power Module) that further includes a driver for driving power semiconductor devices and a control integrated circuit (IC) having a function of detecting and protecting against an abnormality such as overcurrent and the like (see, for example, Japanese Laid-Open Patent Publication No. 2013-258321). Japanese Laid-Open Patent Publication No. 2013-258321 discloses an exemplary configuration of a semiconductor module included in an inverter device that drives a three-phase AC motor.

FIG. 12 is a circuit diagram illustrating an example of an inverter device using a conventional semiconductor module; FIG. 13 is a plan view illustrating an exemplary configuration of the conventional semiconductor module; FIG. 14 is a cross-sectional view illustrating the exemplary configuration of the conventional semiconductor module; and FIG. 15 is a cross-sectional view illustrating an example of how the conventional semiconductor module is attached.

As illustrated in FIG. 12, a conventional semiconductor module 100 includes three upper and lower arm portions, thereby forming a three-phase inverter circuit. The semiconductor module 100 uses IGBTs (Insulated Gate Bipolar Transistors) and FWDs (Free Wheeling Diodes) as power semiconductor devices.

In the semiconductor module 100, a first upper and lower arm portion is formed by connecting an anti-parallel connected IGBT 101 and FWD 102 in series with an anti-parallel connected IGBT 103 and FWD 104. A second upper and lower arm portion is formed by connecting an anti-parallel connected IGBT 105 and FWD 106 in series with an anti-parallel connected IGBT 107 and FWD 108. A third upper and lower arm portion is formed by connecting an anti-parallel connected IGBT 109 and FWD 110 in series with an anti-parallel connected IGBT 111 and FWD 112. Collector terminals of the IGBTs 101, 105, and 109 of the first through third upper and lower arm portions are connected to a power supply positive terminal P, and emitter terminals of the IGBTs 103, 107, and 111 of the first through third upper and lower arm portions are connected to a power supply negative terminal N. Midpoints of the first through third upper and lower arm portions are connected to main current terminals U, V, and W, respectively. The main current terminals U, V, and W are connected to input terminals of corresponding phases of a motor 120. Note that in this circuit diagram, control ICs that control the IGBTs 101 and 103, the IGBTs 105 and 107, and the IGBTs 109 and 111 are omitted.

For this semiconductor module 100, two capacitors 131 and 132 connected in series are connected between the power supply positive terminal P and the power supply negative terminal N, and a common connection point of the capacitors 131 and 132 is connected to a housing of the inverter device and is thereby connected to ground.

Regarding the configuration of the semiconductor module 100, as illustrated in FIGS. 13 and 14, six circuit patterns 141 are formed on an Al (aluminum) insulating substrate 140, and an IGBT chip 142 and an FWD chip 143 are mounted on each of the circuit patterns 141. A circuit block including the Al insulating substrate 140, the circuit patterns 141, the IGBT chips 142, and the FWD chips 143 is bonded to a lower surface of a terminal case 150 so as to cover a center opening thereof. Control ICs 152 are mounted on lead terminals (lead frame) 151 that are inserted upon molding of the terminal case 150. In this state, a bonding wire 153 electrically connects between a lead terminal 151a and the control IC 152, and between the control IC 152 and the IGBT chip 142. Further, a bonding wire 154 electrically connects between the IGBT chip 142 and the FWD chip 143, and between the FWD chip 143 and a lead terminal 151b. Furthermore, as illustrated in FIGS. 13 and 14, an electrical connection is made between the circuit pattern 141 and the lead terminal 151b, and between the control IC 152 and a sense emitter terminal of the IGBT chip 142. After that, the terminal case 150 is filled with resin 160, so that the circuit block, the control ICs 152, and the bonding wires 153 and 154 are resin-sealed.

A heat spreader 113 is joined to a surface of the Al insulating substrate 140 opposite to a surface thereof on which the circuit patterns 141 are formed. The heat spreader 113 is for dissipating heat generated by the IGBT chips 142 and the FWD chips 143 to the outside.

As illustrated in FIG. 15, for example, the semiconductor module 100 is attached to a heat sink 170. More specifically, the semiconductor module 100 is arranged such that the heat spreader 113 is in contact with the heat sink 170 through a thermal compound 171. Further, the semiconductor module 100 is mounted on a printed circuit board 180 on which the capacitors 131 and 132 are mounted. The printed circuit board 180 is fixed to the heat sink 170 with a screw 190. The screw 190 electrically connects a circuit pattern 181, which is commonly connected to the capacitors 131 and 132, to the heat sink 170. Accordingly, the common connection point of the capacitors 131 and 132 is connected to the heat sink 170 or a housing serving also as the heat sink 170, and is thereby connected to ground.

With the configuration described above, the control ICs 152 perform switching control of the IGBTs 101 and 103, the IGBTs 105 and 107, and the IGBTs 109 and 111 at arbitrary timing, thereby making it possible to control the motor 120 to rotate at a desired speed. Noise generated by the switching control is bypassed by the capacitors 131 and 132 and is connected to ground so as to be reduced. This ground is hereinafter referred to as chassis ground.

In the example described above, the semiconductor module 100 includes IGBTs as power semiconductor devices. However, even in the case where power transistors or MOSFETs (Metal Oxide Semiconductor Field Effect Transistors) are used as power semiconductor devices, it is possible to form a semiconductor module as in the case where IGBTs are used.

In a conventional semiconductor module, noise generated by switching control of a power semiconductor device is bypassed by an external capacitor and is connected to ground so as to be reduced. Further, in the conventional semiconductor module, a heat spreader is electrically insulated from a circuit block by an Al insulating substrate in terms of direct current. However, in the conventional semiconductor module, a circuit pattern is capacitively coupled to the heat spreader (by parasitic capacitances 114 in FIG. 12) via the Al insulating substrate. Therefore, if the potential of the circuit pattern changes, the potential of the heat spreader also changes due to the capacitive coupling, so that radiation noise is increased. On the other hand, in the case where the heat spreader and the housing are electrically connected, a noise current due to the potential change in the heat spreader is returned into the module via the housing. However, if an insulating thermal compound is applied between the heat spreader and the housing, there may be a capacitive coupling (a parasitic capacitance 115 in FIG. 12) between the heat spreader and the housing, or there may be some points of direct electrical connection, depending on the manner in which the module is pressed and the flatness of the heat dissipation surface. Therefore, electrical connection points between the heat spreader and the housing vary, which is likely to cause individual differences in noise characteristics. Further, in the case where the capacitor that bypasses a noise current is externally connected to the semiconductor module, the size of the circuit substrate on which the semiconductor module is mounted is increased. In addition, as indicated by the broken-line arrows in FIG. 12, the noise current loop is enlarged, so that the noise reduction effect is reduced.

SUMMARY OF THE INVENTION

According to the present invention, there is provided a semiconductor module including: a circuit block including an electrically insulating layer, a plurality of circuit patterns formed of a conductive plate or foil on one surface of the electrically insulating layer, and power semiconductors mounted on the circuit patterns; and a heat spreader formed of a conductive plate on another surface of the electrically insulating layer; wherein at least one of the circuit patterns is connected to one electrode of a capacitor, and wherein another electrode of the capacitor is electrically connected to the heat spreader.

The object and advantages of the invention will be realized and attained by means of the elements and combinations particularly pointed out in the claims.

It is to be understood that both the foregoing general description and the following detailed description are provided by way of example and explanatory and are not restrictive of the invention.

BRIEF DESCRIPTION OF DRAWINGS

FIGS. 4A and 4B illustrate an exemplary configuration of a semiconductor module according to a second embodiment, wherein FIG. 4A is a plan view of the semiconductor module; and FIG. 4B is an enlarged cross-sectional view of a portion B in FIG. 4A;

FIGS. 5A and 5B illustrate modifications of means for electrically connecting capacitors to a heat spreader with the minimum noise current loop, wherein FIG. 5A illustrates a first modification of the connecting means; and FIG. 5B illustrates a second modification of the connecting means;

FIGS. 10A to 10E illustrate implementation examples of a semiconductor module according to the third through fifth embodiments, wherein FIG. 10A illustrates a first implementation example; FIG. 10B illustrates a second implementation example; FIG. 10C illustrates a third implementation example; FIG. 10D illustrates a fourth implementation example; and FIG. 10E illustrates a fifth implementation example;

FIGS. 11A and 11B illustrates circuit diagrams of examples of a secondary-side circuit of a DC-DC converter using a semiconductor module, wherein FIG. 11A illustrates a circuit using a conventional semiconductor module; and FIG. 11B illustrates a circuit using a semiconductor module according to a sixth embodiment;

DETAILED DESCRIPTION OF THE INVENTION

Embodiments of the present invention will be described in detail below with reference to the drawings, in connection with an example in which the present invention is applied to an inverter device. Note that two or more embodiments may be implemented in combination as long as no inconsistency arises.

Figure 1:
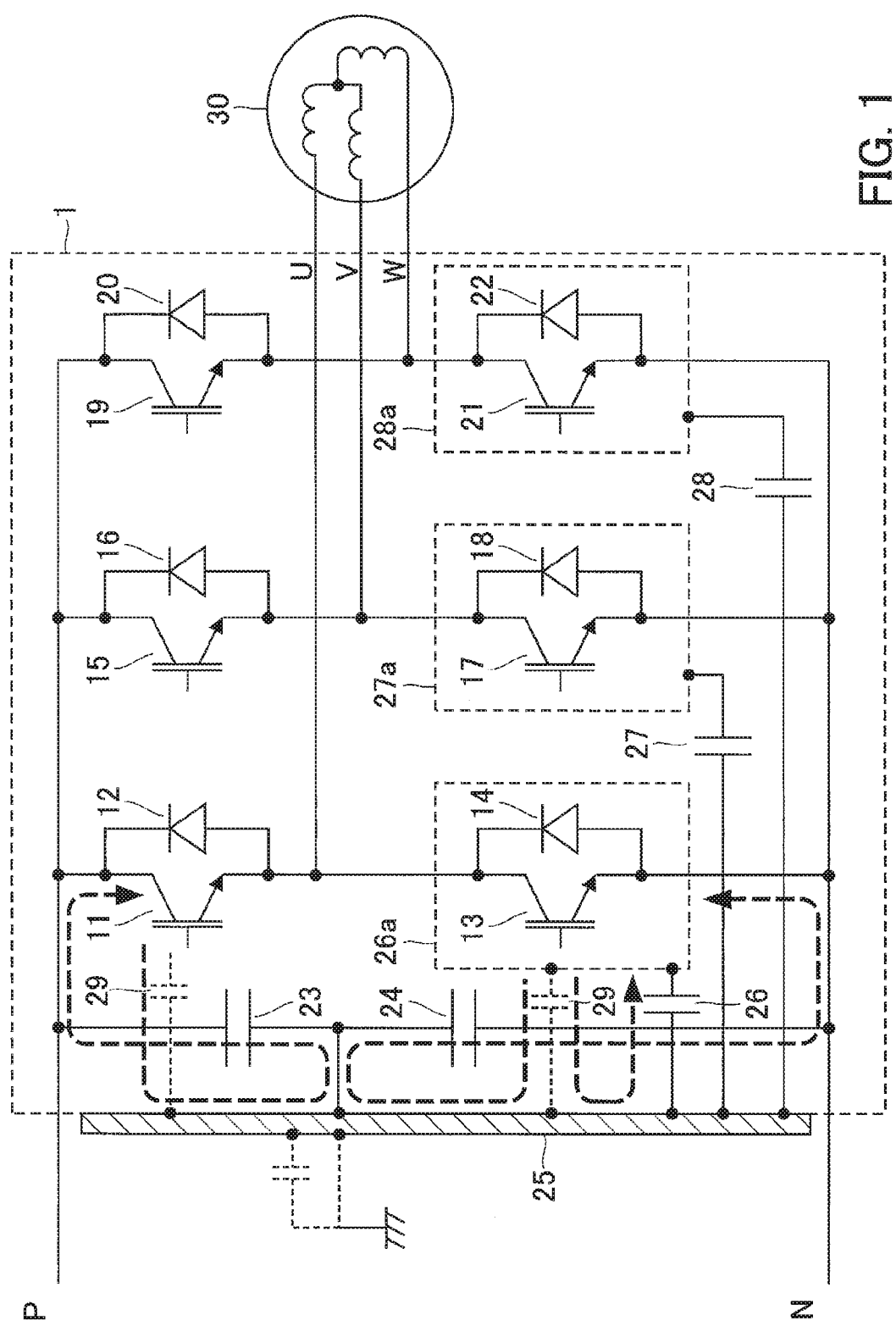
FIG. 1 is a circuit diagram illustrating an example of an inverter device using a semiconductor module of the present invention.

FIG. 1 is a circuit diagram illustrating an example of an inverter device using a semiconductor module of the present invention.

A semiconductor module 1 according to the present invention includes three upper and lower arm portions between a power supply positive terminal P and a power supply negative terminal N, thereby forming a three-phase inverter circuit. In the semiconductor module 1, IGBTs are used as power semiconductor modules for switching.

A first upper and lower arm portion includes an IGBT 11, an FWD 12, an IGBT 13, and an FWD 14. A collector terminal of the IGBT 11 and a cathode terminal of the FWD 12 are connected to the power supply positive terminal P. An emitter terminal of the IGBT 13 and an anode terminal of the FWD 14 are connected to the power supply negative terminal N. An emitter terminal of the IGBT 11, an anode terminal of the FWD 12, a collector terminal of the IGBT 13, and a cathode terminal of the FWD 14 are connected to each other, and are also connected to a main current output terminal U.

A second upper and lower arm portion includes an IGBT 15, an FWD 16, an IGBT 17, and an FWD 18. A collector terminal of the IGBT 15 and a cathode terminal of the FWD 16 are connected to the power supply positive terminal P. An emitter terminal of the IGBT 17 and an anode terminal of the FWD 18 are connected to the power supply negative terminal N. An emitter terminal of the IGBT 15, an anode terminal of the FWD 16, a collector terminal of the IGBT 17, and a cathode terminal of the FWD 18 are connected to each other, and are also connected to a main current output terminal V.

A third upper and lower arm portion includes an IGBT 19, an FWD 20, an IGBT 21, and an FWD 22. A collector terminal of the IGBT 19 and a cathode terminal of the FWD 20 are connected to the power supply positive terminal P. An emitter terminal of the IGBT 21 and an anode terminal of the FWD 22 are connected to the power supply negative terminal N. An emitter terminal of the IGBT 19, an anode terminal of the FWD 20, a collector terminal of the IGBT 21, and a cathode terminal of the FWD 22 are connected to each other, and are also connected to a main current output terminal W.

The main current output terminals U, V, and W of the semiconductor module 1 are connected to input terminals of corresponding phases of a motor 30.

Further, in the semiconductor module 1, one terminal of the capacitor 23 is connected to the power supply positive terminal P to which a maximum potential is applied, and one terminal of the capacitor 24 is connected to the power supply negative terminal N to which a minimum potential is applied. The other terminals of the capacitors 23 and 24 are connected to each other, and are also electrically connected to a heat spreader 25 of the semiconductor module 1. A common connection point of the capacitors 23 and 24 is electrically connected to the heat spreader 25 through an electrically insulating layer in the semiconductor module 1, thereby minimizing the noise current loop.

Further, in the semiconductor module 1, a capacitor 26 is connected between a circuit pattern 26a with the IGBT 13 and the FWD 14 mounted thereon and the heat spreader 25. Similarly, a capacitor 27 is connected between a circuit pattern 27a with the IGBT 17 and the FWD 18 mounted thereon and the heat spreader 25, and a capacitor 28 is connected between a circuit pattern 28a with the IGBT 21 and the FWD 22 mounted thereon and the heat spreader 25. The capacitors 26, 27, and 28 are also electrically connected to the heat spreader 25 through the electrically insulating layer in the semiconductor module 1, thereby minimizing the noise current loop. Accordingly, the circuit patterns 26a, 27a, and 28a with a greater potential change (dv/dt) on which the IGBTs 13, 17, and 21 that perform switching operations are mounted are connected to the heat spreader 25 with the minimum noise current loop.

Further, the circuit patterns 26a, 27a, and 28a with the IGBTs 13, 17, and 21 mounted thereon and circuit patterns (not illustrated) with the IGBTs 11, 15, and 19 mounted thereon are capacitively coupled to the heat spreader 25 via the electrically insulating layer by parasitic capacitances 29.

A noise current in upper arm portions of the first through third upper and lower arm portions flows through a minimum loop flowing to the circuit patterns (not illustrated) on which the IGBTs 11, 15, and 19 are mounted, via the parasitic capacitance 29, the heat spreader 25, and the capacitor 23. In the lower arm portions of the first through third upper and lower arm portions, two types of noise currents flow. For example, in the case of the lower arm portion of the first upper and lower arm portion, a first noise current flows through a minimum loop flowing to the circuit pattern 26a via the parasitic capacitance 29, the heat spreader 25, the capacitor 24, and the potential of the power supply negative terminal N. A second noise current flows through a minimum loop flowing to the circuit pattern 26a via the parasitic capacitance 29, the heat spreader 25, and the capacitor 26.

Note that in the example illustrated in FIG. 1, not all the capacitors 23, 24, 26, 27, and 28 in the semiconductor module 1 need to be provided, but capacitors may be provided where needed, such as locations where the noise level is especially high.

Further, the heat spreader 25 of the semiconductor module 1 is attached to the housing of the inverter device, so that the noise bypassed by the capacitors 23, 24, 26, 27, and 28 flows to chassis ground.

In the following, a specific embodiment of the semiconductor module 1 will be described.

Figure 2:
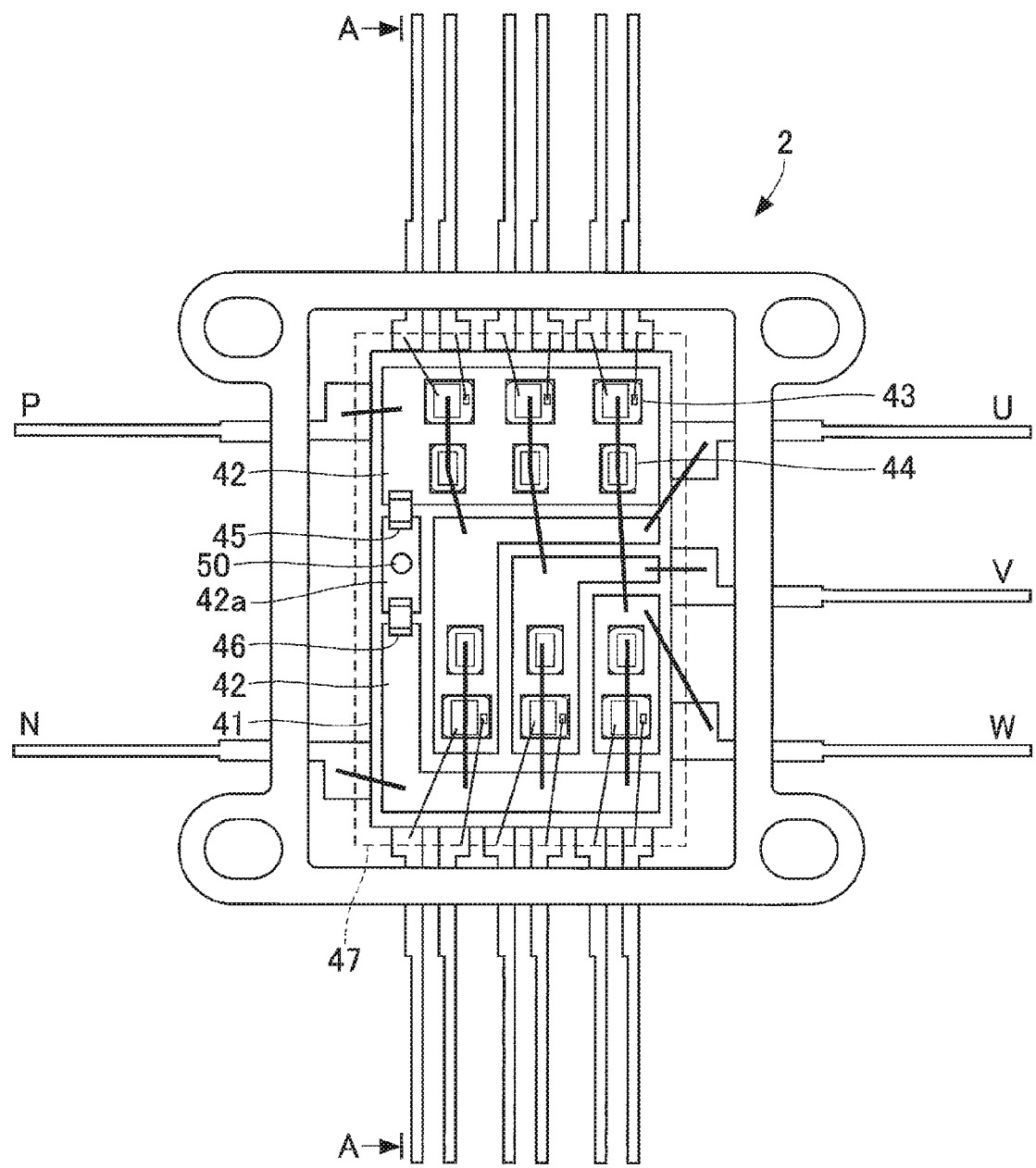
FIG. 2 is a plan view illustrating an exemplary configuration of a semiconductor module according to a first embodiment.
Figure 3:
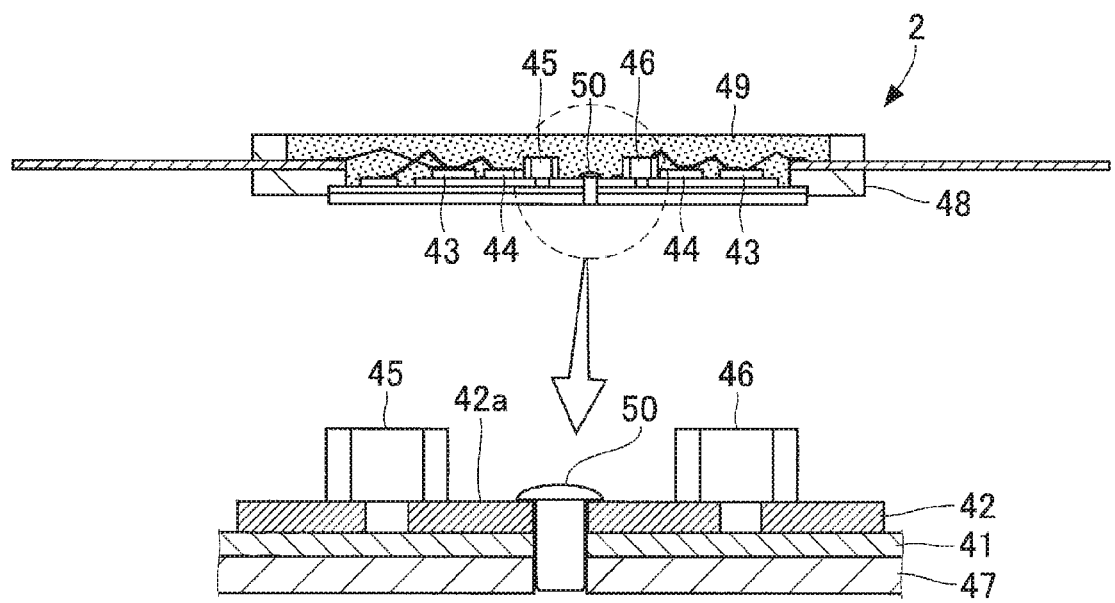
FIG. 3 is a cross-sectional view taken in the direction of arrows A-A in FIG. 2.

FIG. 2 is a plan view illustrating an exemplary configuration of a semiconductor module according to a first embodiment, and FIG. 3 is a cross-sectional view taken in the direction of arrows A-A in FIG. 2.

A semiconductor module 2 according to the first embodiment includes an Al insulating substrate 41 serving as an electrically insulating layer. Circuit patterns 42 are formed on the Al insulating substrate 41. Power semiconductor chips 43 and 44 and capacitors 45 and 46 are mounted on the circuit patterns 42. A heat spreader 47 is joined to a surface of the Al insulating substrate 41 opposite to a surface thereof on which the circuit patterns 42 are formed. A circuit block including the Al insulating substrate 41, the circuit patterns 42, the power semiconductor chips 43 and 44, and the capacitors 45 and 46 is accommodated in a terminal case 48 made of PPS (Poly Phenylene Sulfide) resin, and is sealed with resin 49 such as epoxy and the like.

The Al insulating substrate 41 may be an organic insulating layer made of a combination of aluminum having a high thermal conductivity and insulating resin having a low thermal resistance such as epoxy, liquid crystal polymer, and the like. Note that the electrically insulating layer may be an inorganic insulating layer made of ceramic such as silicon nitride and the like. Further, a DCB (Direct Copper Bond) substrate including an inorganic insulating layer with copper foils bonded on both surfaces thereof may be used. The circuit patterns 42 are generated by etching a conductive plate or foil formed on one surface of the Al insulating substrate 41, or are generated by applying a conductive plate to one surface of the Al insulating substrate 41.

The power semiconductor chips 43 may be the IGBTs 11, 13, 15, 17, 19, and 21 of FIG. 1, and the power semiconductor chips 44 may be the FWDs 12, 14, 16, 18, 20, and 22 of FIG. 1. Further, the capacitors 45 and 46 may be capacitors 23 and 24 of FIG. 1. The heat spreader 47 corresponds to the heat spreader 25 of FIG. 1, and is made of a copper or aluminum plate.

Referring to the plan view of FIG. 2, one end of each of the capacitors 45 and 46 is mounted on a common circuit pattern 42a that is formed on the Al insulating substrate 41 at substantially the center in a long-side direction of the heat spreader 47 having a rectangular shape. A conductive pin 50 is pressed into a hole formed in the circuit pattern 42a, the Al insulating substrate 41, and the heat spreader 47, so that the circuit pattern 42a is electrically connected to the heat spreader 47. Accordingly, a noise current having flowed to the heat spreader 47 due to a potential change in the circuit pattern 42a and the parasitic capacitances 29 is returned from the pin 50 and the capacitors 45 and 46 to the circuit patterns 42 having the same potential as the power supply positive terminal P and the power supply negative terminal N. Thus, the noise current loop is minimized.

Figure 4A:
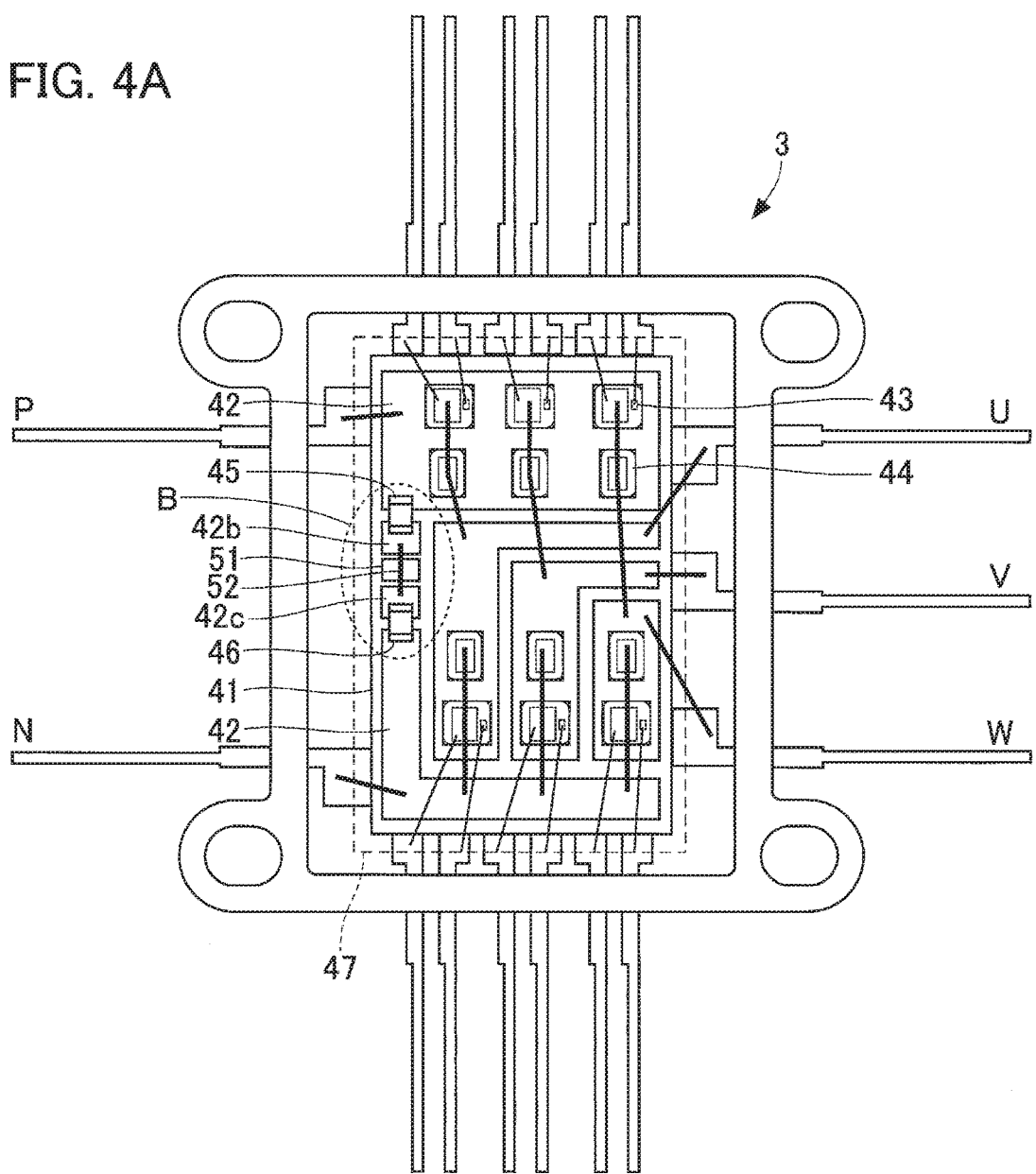
Figure 4B:
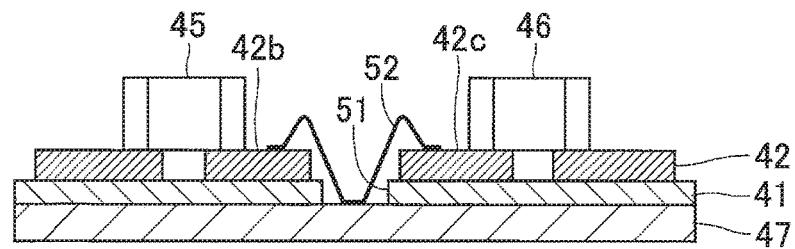

FIGS. 4A and 4B illustrate an exemplary configuration of a semiconductor module according to a second embodiment, wherein FIG. 4A is a plan view of the semiconductor module; and FIG. 4B is an enlarged cross-sectional view of a portion B in FIG. 4A. In FIGS. 4A and 4B, elements identical or corresponding to those in FIGS. 2 and 3 are indicated by the same reference numerals.

A semiconductor module 3 according to the second embodiment is different from the semiconductor module 2 according to the first embodiment in means for electrically connecting the capacitors 45 and 46 to the heat spreader 47 with a minimum noise current loop. More specifically, an opening 51 is formed in the Al insulating substrate 41 at substantially the center in the long-side direction of the heat spreader 47 having a rectangular shape such that a surface of the heat spreader 47 in contact with the Al insulating substrate 41 is exposed. Further, circuit patterns 42b and 42c are formed on the Al insulating substrate 41 so as to be adjacent to the opening 51 in the long-side direction of the heat spreader 47. One end of the capacitor 45 is connected to the circuit pattern 42b, and one end of the capacitor 46 is connected to the circuit pattern 42c. The circuit patterns 42b and 42c are connected to the heat spreader 47 by a bonding wire 52 through the opening 51. A copper wire, an aluminum wire, or a gold wire is used as the bonding wire 52.

In the manner described above, one end of each of the capacitors 45 and 46 is electrically connected to the heat spreader 47 in close proximity thereto by the bonding wire 52. Accordingly, a noise current having flowed to the heat spreader 47 due to a potential change in the circuit patterns 42b and 42c and the parasitic capacitances 29 is returned from the bonding wire 52 and the capacitors 45 and 46 to the circuit patterns 42 having the same potential as the power supply positive terminal P and the power supply negative terminal N. Thus, the noise current loop is minimized.

Figure 5A:
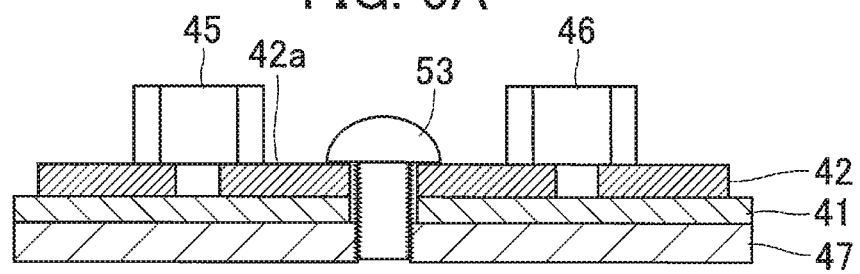
Figure 5B:
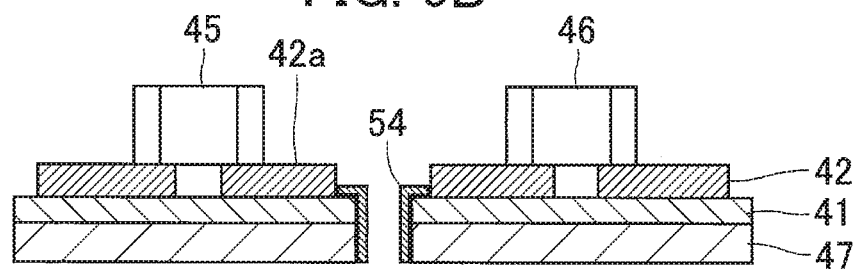

FIGS. 5A and 5B illustrate modifications of means for electrically connecting capacitors to a heat spreader with the minimum noise current loop, wherein FIG. 5A illustrates a first modification of the connecting means; and FIG. 5B illustrates a second modification of the connecting means. In FIGS. 5A and 5B, elements identical or corresponding to those in FIGS. 3, 4A and 4B are indicated by the same reference numerals.

In the first modification of the connecting means, as illustrated in FIG. 5A, the connecting means is implemented by a conductive screw 53. More specifically, the screw 53 is screwed into the heat spreader 47 through a hole formed in the circuit pattern 42a and the Al insulating substrate 41, so that the common circuit pattern 42a to which one end of each of the capacitors 45 and 46 is connected is electrically connected to the heat spreader 47.

In the second modification of the connecting means, as illustrated in FIG. 5B, a hole is formed to extend through the Al insulating substrate 41 and the heat spreader 47 that are joined to each other, and plating 54 is applied on the inner wall of the hole. With this plating processing, the circuit pattern 42a is electrically connected to the heat spreader 47 via the plating 54.

Figure 6:
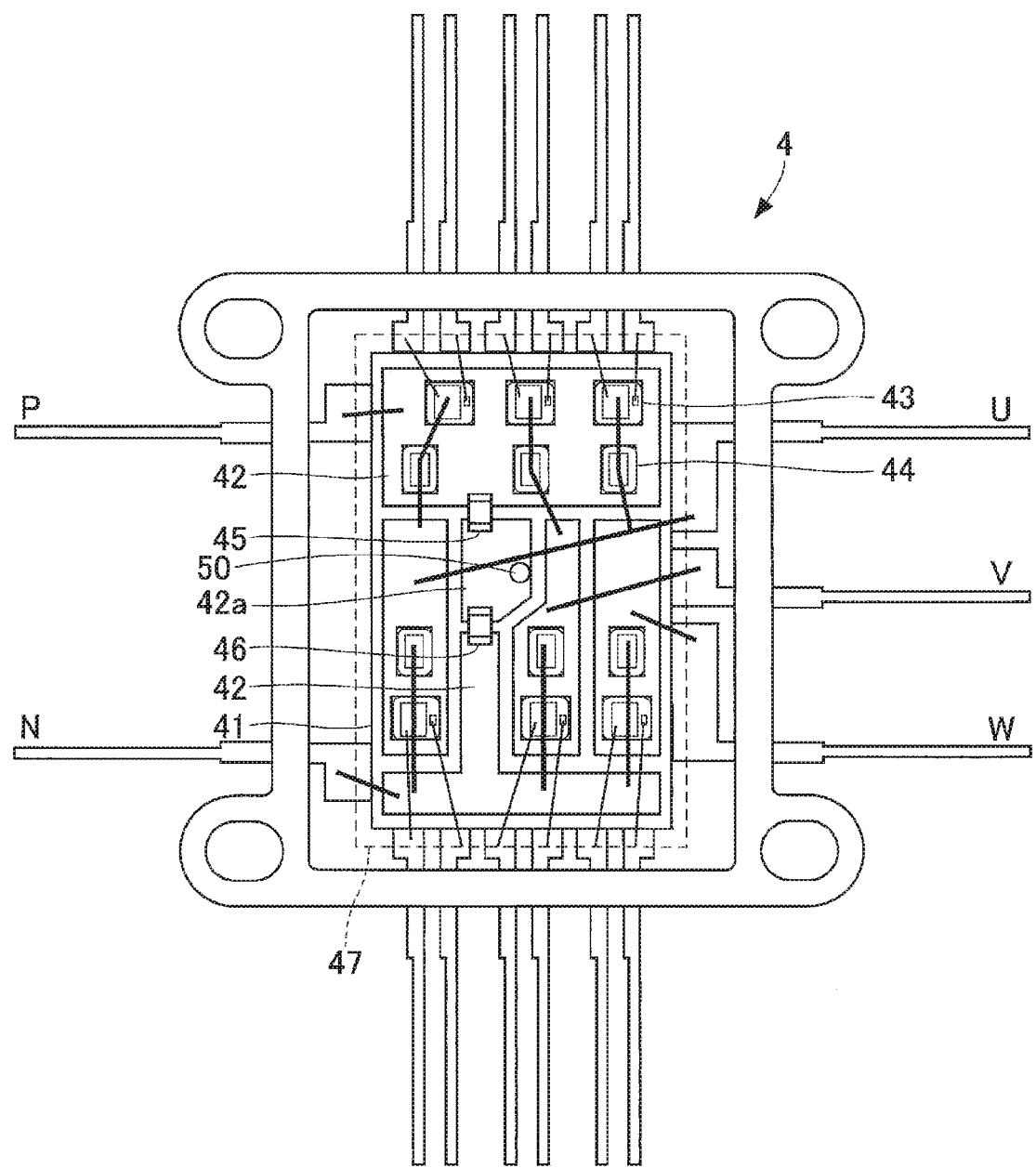
FIG. 6 illustrates a first exemplary configuration of a semiconductor module according to a third embodiment.
Figure 7:
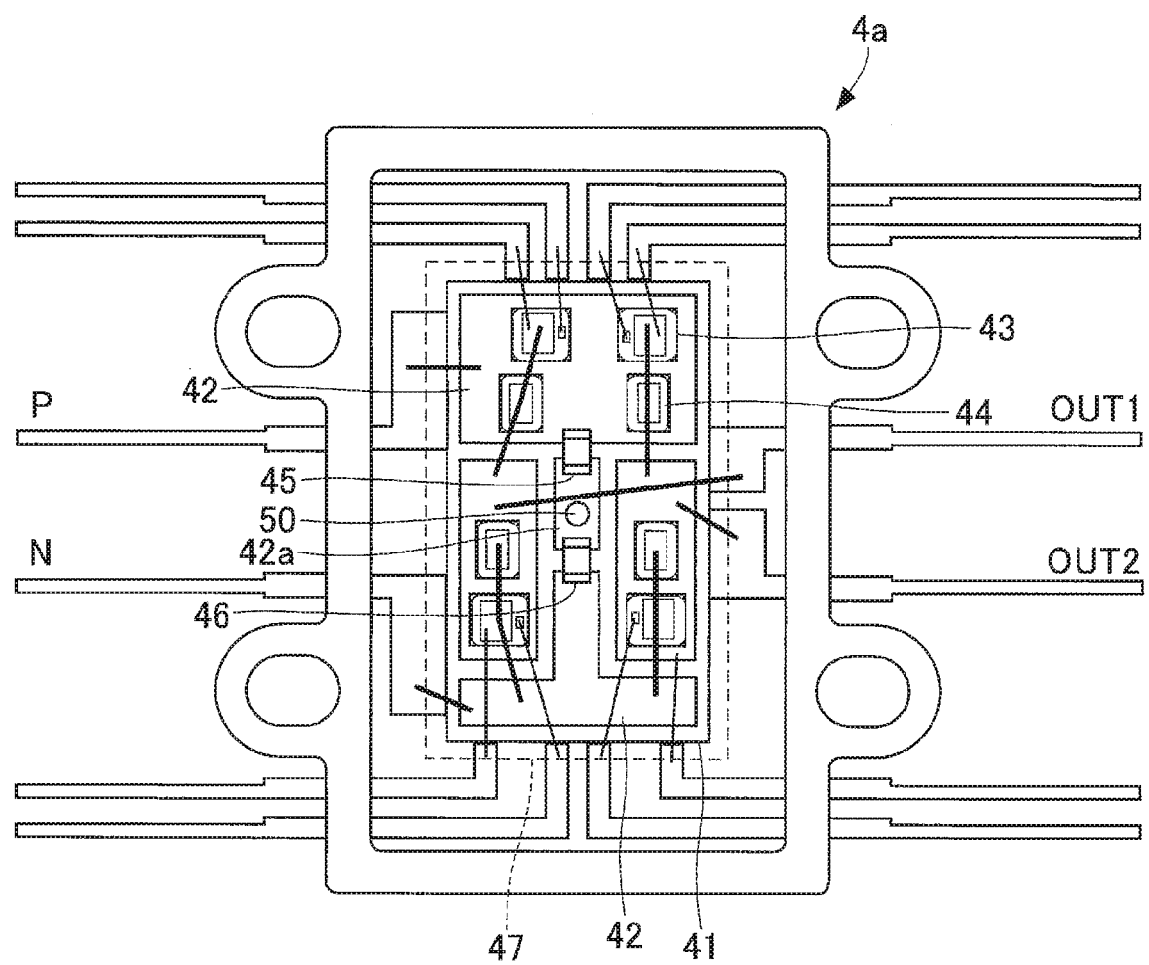
FIG. 7 illustrates a second exemplary configuration of the semiconductor module according to the third embodiment.

FIG. 6 illustrates a first exemplary configuration of a semiconductor module according to a third embodiment, and FIG. 7 illustrates a second exemplary configuration of the semiconductor module according to the third embodiment. In FIGS. 6 and 7, elements identical or corresponding to those in FIG. 2 are indicated by the same reference numerals.

A semiconductor module 4 according to the third embodiment is different from the semiconductor module according to the first embodiment in that the position of the pin 50 for electrical connection to the heat spreader 47 is changed to substantially the center in the long-side direction and short-side direction of the terminal case 48 or the heat spreader 47.

First, the first exemplary configuration illustrated in FIG. 6 is the configuration applied to the three-phase inverter circuit of FIG. 1. One end of the capacitor 45 is connected to the power supply positive terminal P and the other end thereof is connected to the circuit pattern 42a; and one end of the capacitor 46 is connected to the power supply negative terminal N and the other end thereof is connected to the circuit pattern 42a. Accordingly, a noise current due to a potential change in the circuit pattern 42a is returned via the capacitor 45, 46, and a noise current having flowed to the heat spreader 47 due to the parasitic capacitances 29 is returned from the substantial center position of the heat spreader 47 via the pin 50 and the capacitor 45, 46, to the circuit patterns 42 having the same potential as the power supply positive terminal P and the power supply negative terminal N. Thus, the noise current loop is minimized. Further, the noise current flows to chassis ground with a stable potential, via the heat spreader 47.

On the other hand, the second exemplary configuration illustrated in FIG. 7 is the configuration of a semiconductor module 4a according to the third embodiment applied to a two-phase inverter circuit having two output terminals OUT1 and OUT2, in which lead terminals extend outward in two directions. In the semiconductor module 4a as well, one end of the capacitor 45 is connected to the power supply positive terminal P and the other end thereof is connected to the circuit pattern 42a; and one end of the capacitor 46 is connected to the power supply negative terminal N and the other end thereof is connected to the circuit pattern 42a. Further, the circuit pattern 42a is electrically connected to the heat spreader 47 by the pin 50 at the substantial center position of the heat spreader 47. Accordingly, a noise current due to a potential change in the circuit pattern 42a is returned via the capacitor 45, 46, and a noise current having flowed to the heat spreader 47 due to the parasitic capacitances 29 is returned from the substantial center position of the heat spreader 47 via the pin 50 and the capacitor 45, 46, to the circuit patterns 42 having the same potential as the power supply positive terminal P and the power supply negative terminal N. Thus, the noise current loop is minimized. Further, the noise current flows to chassis ground with a stable potential, via the heat spreader 47.

Figure 8:
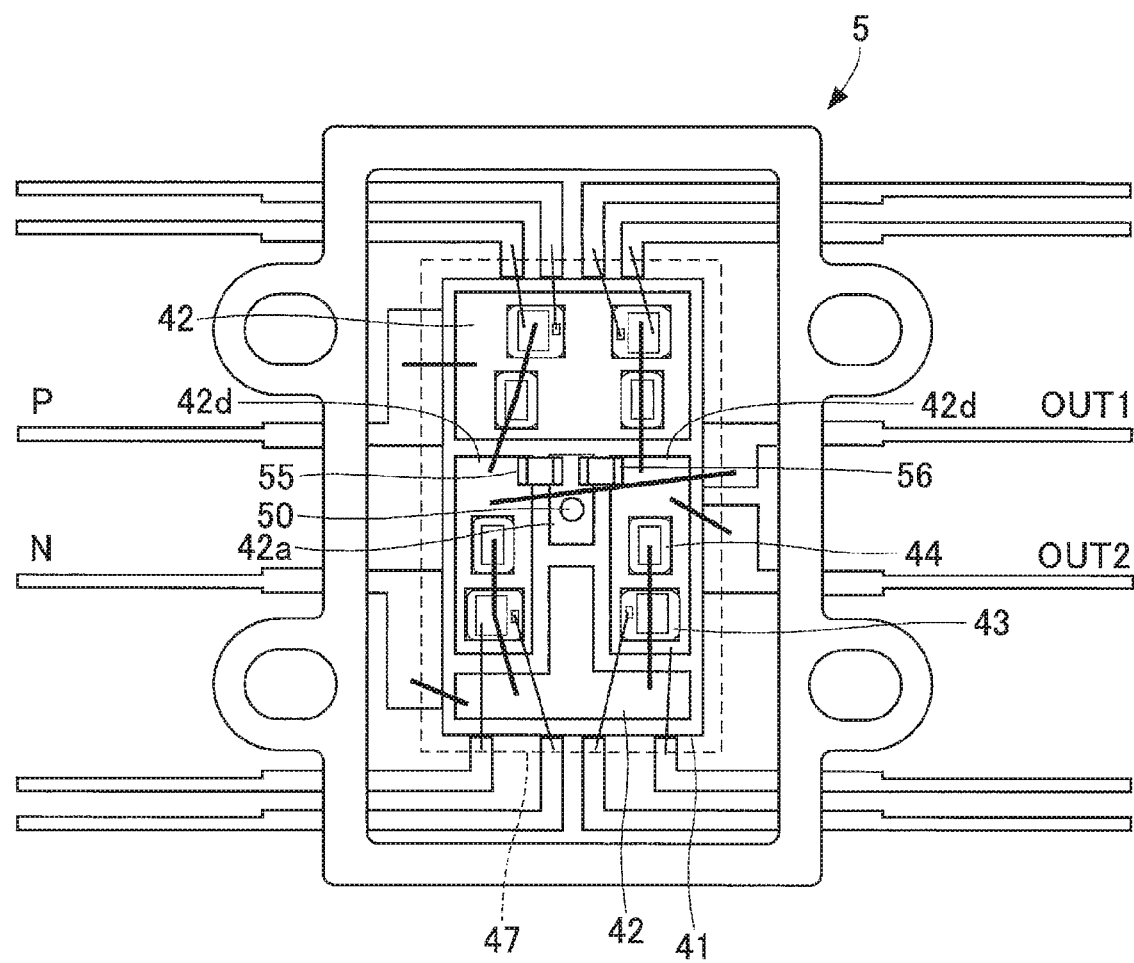
FIG. 8 illustrates an exemplary configuration of a semiconductor module according to a fourth embodiment.

FIG. 8 illustrates an exemplary configuration of a semiconductor module according to a fourth embodiment. In FIG. 8, elements identical or corresponding to those in FIG. 7 are indicated by the same reference numerals.

In a semiconductor module 5 according to the fourth embodiment, a circuit pattern whose noise is bypassed is different from those in the semiconductor modules 2, 3, 4, and 4a according to the first through third embodiments. More specifically, in the semiconductor modules 2, 3, 4, and 4a according to the first through third embodiments, the circuit patterns 42 connected to the power supply negative terminal N and the power supply positive terminal P are bypassed by the capacitors 45 and 46. On the other hand, in the semiconductor module 5 according to the fourth embodiment, circuit patterns 42d with a greater potential change (dv/dt) in the circuit block are bypassed by capacitors 55 and 56. The circuit patterns 42d with a greater potential change (dv/dt) are areas of the lower arm portions where the power semiconductor chips 43 and 44 are mounted, and the capacitors 55 and 56 correspond to the capacitors 26, 27, and 28 illustrated in FIG. 1.

In the semiconductor module 5 as well, a noise current having flowed to the heat spreader 47 due to a potential change in the circuit patterns 42d and the parasitic capacitances 29 is returned from the pin 50 and the capacitors 45 and 46 to the circuit patterns 42 having the same potential as the power supply positive terminal P and the power supply negative terminal N. Thus, the noise current loop is minimized.

Figure 9:
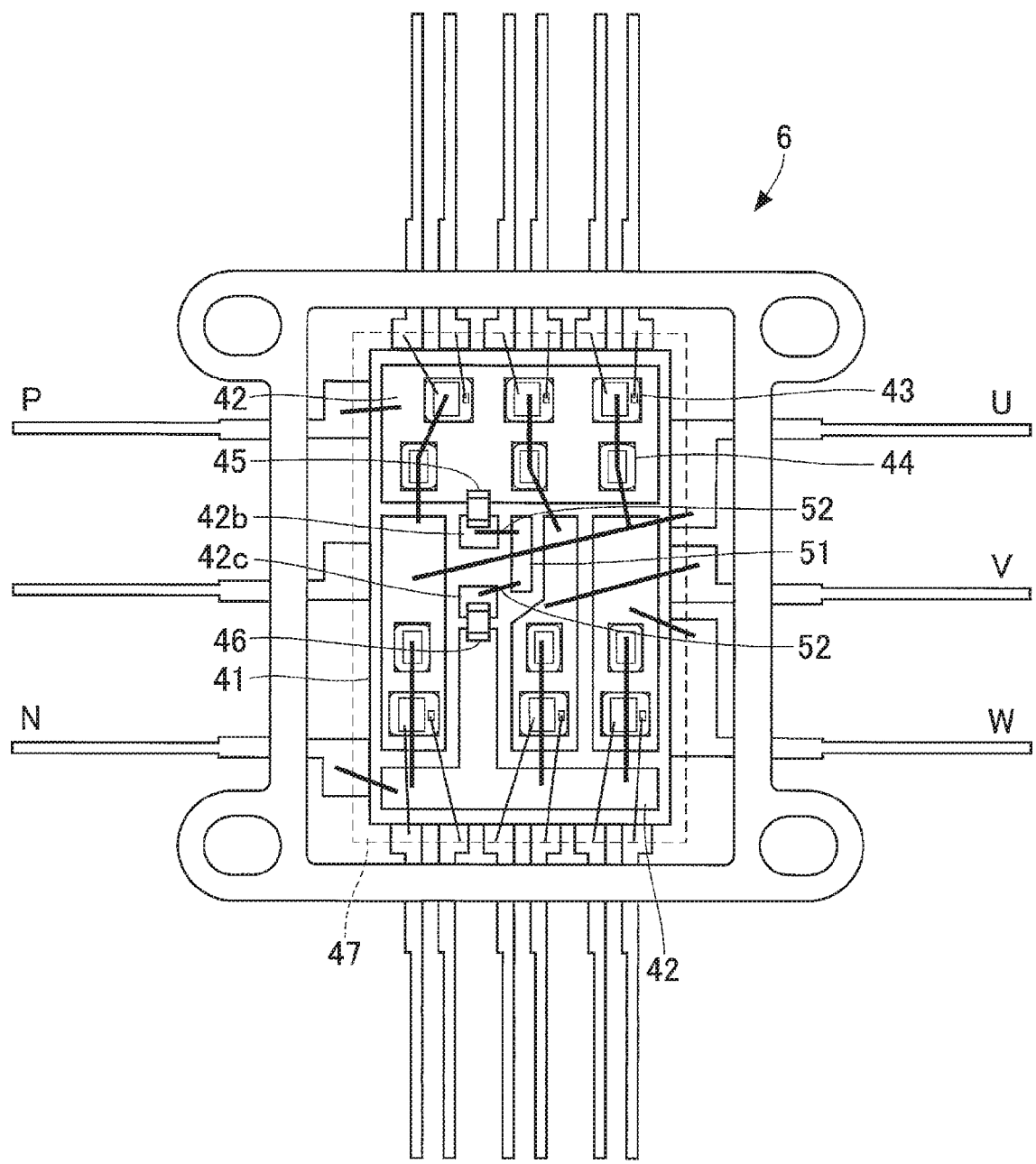
FIG. 9 illustrates an exemplary configuration of a semiconductor module according to a fifth embodiment.

FIG. 9 illustrates an exemplary configuration of a semiconductor module according to a fifth embodiment. In FIG. 9, elements identical or corresponding to those in FIGS. 4A and 4B are indicated by the same reference numerals.

In the semiconductor module 3 according to the second embodiment of FIGS. 4A and 4B, an electrical connection to the heat spreader 47 is made at substantially the center of the long-side direction of the heat spreader 47. On the other hand, in a semiconductor module 6 according to the fifth embodiment, an electrical connection to the heat spreader 47 is made at substantially the center of the heat spreader 47. More specifically, the opening 51 is formed in the Al insulating substrate 41 in the vicinity of the substantial center of the heat spreader 47, and the circuit patterns 42b and 42c with the capacitors 45 and 46 mounted thereon are electrically connected to the heat spreader 47 by the bonding wires 52 through the opening 51. Accordingly, a noise current due to a potential change in the circuit patterns is returned via the capacitor 45, 46, and a noise current having flowed to the heat spreader 47 due to the parasitic capacitances 29 is returned from the substantial center position of the heat spreader 47 via the bonding wires 52 and the capacitor 45, 46, to the circuit patterns 42 having the same potential as the power supply positive terminal P and the power supply negative terminal N. Thus, the noise current loop is minimized. Further, the noise current flows to chassis ground with a stable potential, via the heat spreader 47.

As described above, in the semiconductor modules 4, 4a, 5, and 6 according to the third through fifth embodiments, the capacitors 45, 46, 55, and 56 are connected to the heat spreader 47 at substantially the center of the terminal case 48 or the heat spreader 47. Accordingly, in the case where these semiconductor modules 4, 4a, 5, and 6 are pressed against and attached to the heat sink or the housing, it is possible to maintain the connection position to the heat sink or the housing constant and unchanged. The following describes specific implementation examples that are expected to have such an effect. Note that, in this case, it is preferable that in the semiconductor modules 4, 4a, 5 and 6, the heat spreader 47 has an outwardly curved shape with a bulging outer surface defining a moderate convexity within the operating temperature range due to cure shrinkage of the resin 49 upon resin-sealing of the circuit block.

FIGS. 10A to 10E illustrate implementation examples of a semiconductor module according to the third through fifth embodiments, wherein FIG. 10A illustrates a first implementation example; FIG. 10B illustrates a second implementation example; FIG. 10C illustrates a third implementation example; FIG. 10D illustrates a fourth implementation example; and FIG. 10E illustrates a fifth implementation example. In these diagrams, the outward curvature of the circuit block and the heat spreader 47 is exaggerated for easy understanding. Further, in FIGS. 10A to 10E, only the semiconductor module 4 according to the third embodiment is illustrated as a semiconductor module that is pressed against a heat sink 57 (or a housing).

The first implementation example depicted in FIG. 10A illustrates the case where the semiconductor module 4 is directly pressed against the heat sink 57. In this case, the semiconductor module 4 is electrically connected to the heat sink 57 at only one point at substantially the center of the semiconductor module 4. Accordingly, when the semiconductor module 4 is fixed to the heat sink 57 with four screws, the electrical connection point between the semiconductor module 4 and the heat sink 57 is prevented from varying depending on how tightly the screws are inserted, and therefore variation in noise characteristics is reduced.

The second implementation example depicted in FIG. 10B illustrates the case where a conductive thermal compound 58 is disposed between the semiconductor module 4 and the heat sink 57. In this case, the entire surface of the heat spreader 47 of the semiconductor module 4 is electrically connected via the conductive thermal compound 58. In particular, the semiconductor module 4 is securely electrically connected at substantially the center thereof where the conductive thermal compound 58 has the smallest thickness. Accordingly, even if the four screws fixing the semiconductor module 4 to the heat sink 57 vary in how tightly the screws are inserted, since the semiconductor module 4 is securely electrically connected only at substantially the center of the semiconductor module 4, variation in noise characteristics is reduced.

The third implementation example depicted in FIG. 10C illustrates the case where a non-conductive thermal compound 59 is disposed between the semiconductor module 4 and the heat sink 57. In this case, in the heat sink 57, a circular hole 60 is formed at a position corresponding to substantially the center of the semiconductor module 4. Accordingly, in the semiconductor module 4, the spherical surface defined by the outer surface of the heat spreader 47 is reliably in contact with the edge around the hole 60, so that variation in noise characteristics due to the differences in the manner of pressing is reduced.

The fourth implementation example depicted in FIG. 10D illustrates the case where the non-conductive thermal compound 59 is disposed between the semiconductor module 4 and the heat sink 57. In this case, in the heat sink 57, a circular hole 60 is formed at a position corresponding to substantially the center of the semiconductor module 4, and a conductive plate spring 61 is disposed in the hole 60. Accordingly, the spherical surface defined by the outer surface of the heat spreader 47 of the semiconductor module 4 is in contact with the plate spring 61, so that variation in noise characteristics due to the differences in the manner of pressing is reduced.

The fifth implementation example depicted in FIG. 10E illustrates the case where the non-conductive thermal compound 59 is disposed between the semiconductor module 4 and the heat sink 57. In this case, in the heat sink 57, a plurality of circular holes 60 are formed around a position corresponding to substantially the center of the semiconductor module 4, and a conductive lead rod 62 and a conductive coil spring 63 that biases the lead rod 62 toward the semiconductor module 4 are disposed in each of the holes 60. Accordingly, the spherical surface defined by the outer surface of the heat spreader 47 of the semiconductor module 4 is able to maintain a reliable electrical connection to the heat sink 57 via the lead rods 62 and the coil springs 63, and therefore it is possible to reduce variation in noise characteristics due to the differences in the manner of pressing.

Figure 11A:
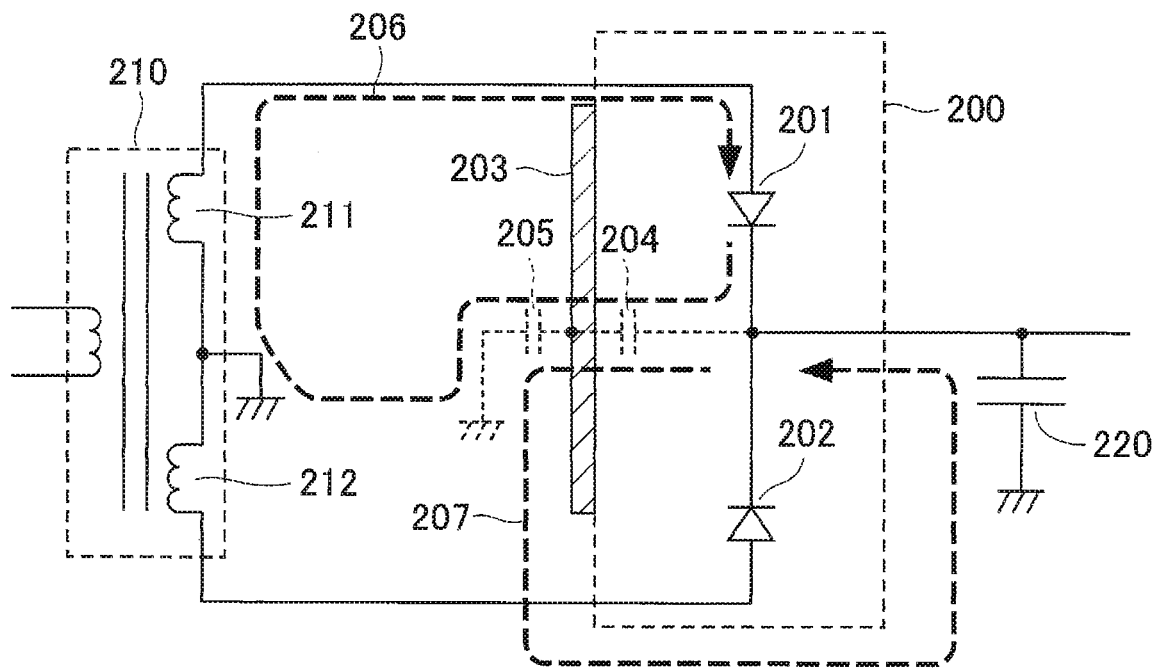
Figure 11B:
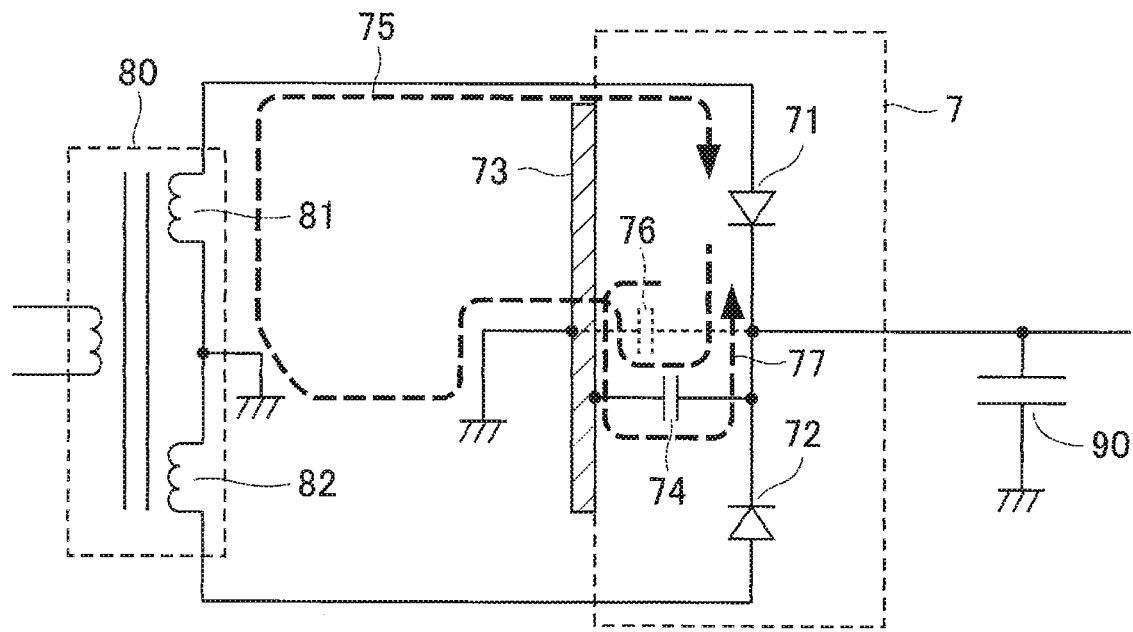
Figure 12:
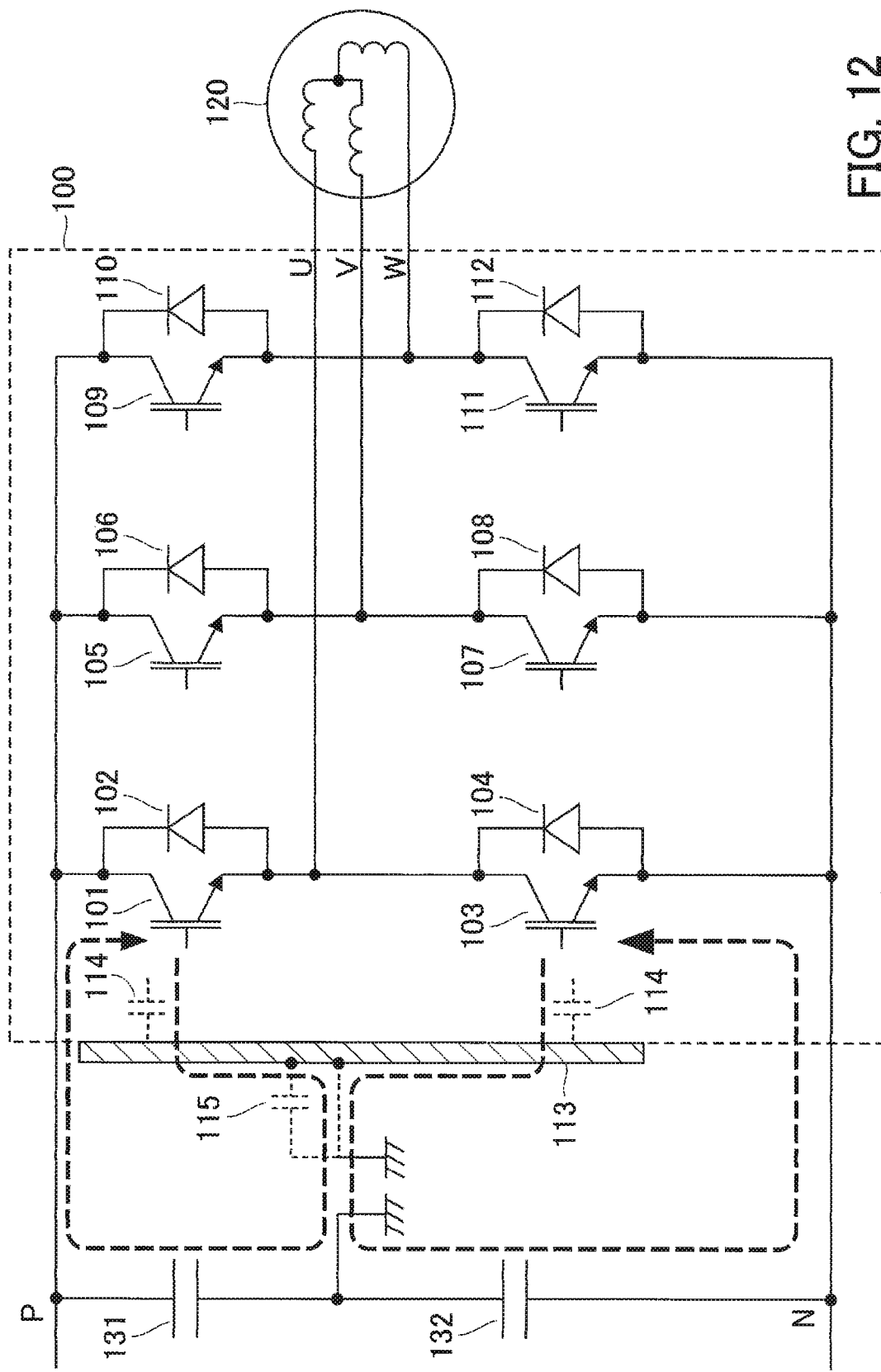
FIG. 12 is a circuit diagram illustrating an example of an inverter device using a conventional semiconductor module.
Figure 13:
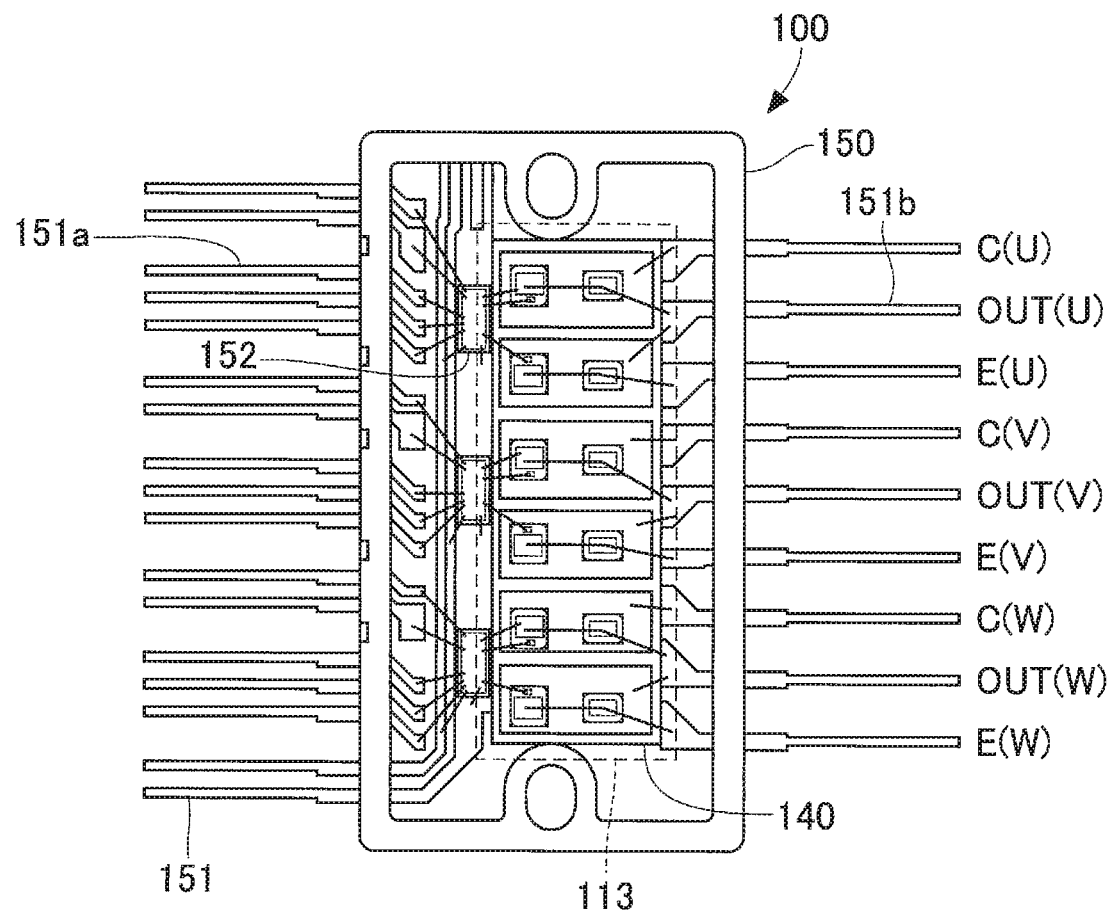
FIG. 13 is a plan view illustrating an exemplary configuration of the conventional semiconductor module.
Figure 14:
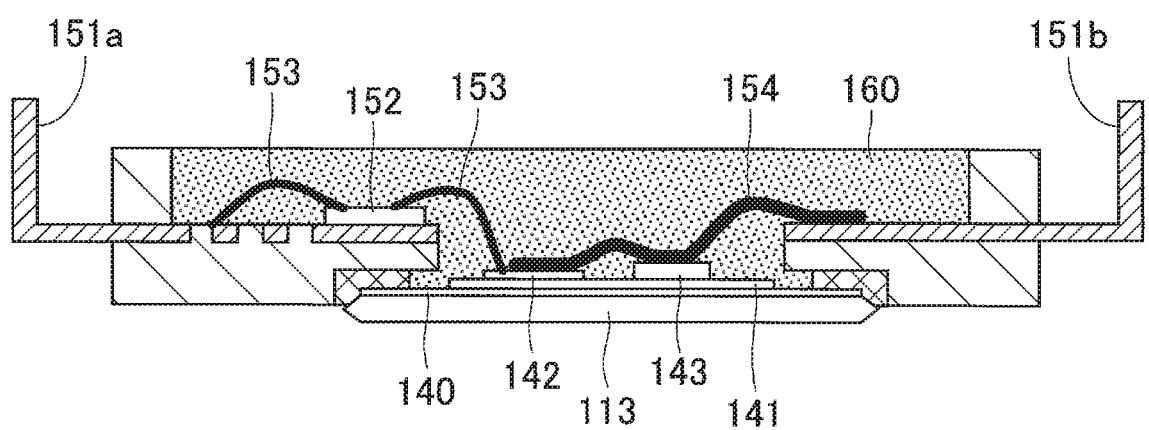
FIG. 14 is a cross-sectional view illustrating the exemplary configuration of the conventional semiconductor module.
Figure 15:
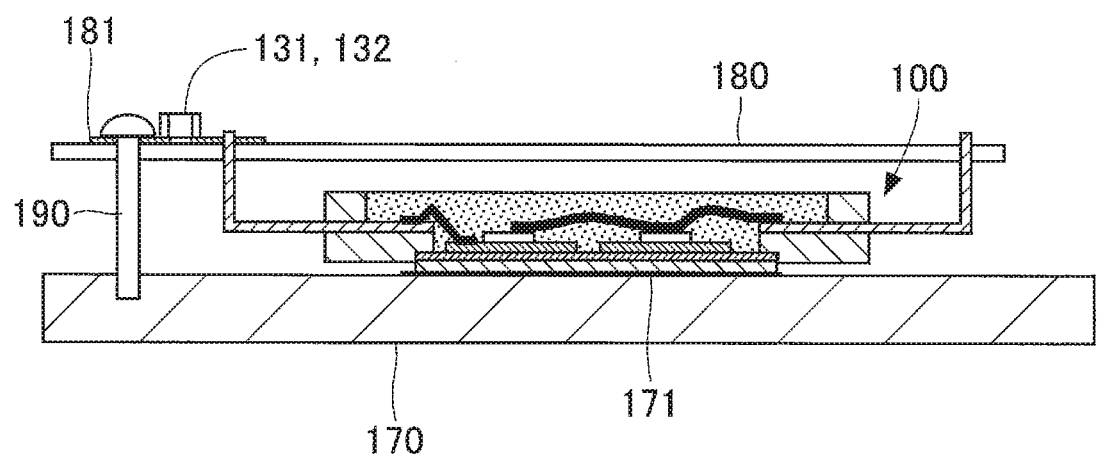
FIG. 15 is a cross-sectional view illustrating an example of how the conventional semiconductor module is attached.

FIGS. 11A and 11B illustrate circuit diagrams of examples of a secondary-side circuit of a DC-DC converter using a semiconductor module, wherein FIG. 11A illustrates a circuit using a conventional semiconductor module; and FIG. 11B illustrates a circuit using a semiconductor module according to a sixth embodiment.

As illustrated in FIG. 11A, a conventional semiconductor module 200 includes two diodes 201 and 202, and a heat spreader 203. In this semiconductor module 200 as well, a circuit block includes an insulating substrate. A circuit pattern is formed on one surface of the insulating substrate, and the diodes 201 and 202 have cathode terminals soldered to the circuit pattern and thus are mounted thereon. The heat spreader 203 is soldered on the other surface of the insulating substrate. Accordingly, the circuit pattern on which the diodes 201 and 202 are mounted is capacitively coupled to the heat spreader 203 by a parasitic capacitance 204 via the insulating substrate. Further, when the semiconductor module 200 is attached to a housing via, for example, a non-conductive thermal compound, the heat spreader 203 is capacitively coupled to the housing by a parasitic capacitance 205.

The secondary-side circuit of the DC-DC converter includes a transformer 210 that transforms an AC voltage into a predetermined voltage, the semiconductor module 200 that performs full-wave rectification, and a capacitor 220 that smooths the rectified voltage. The transformer 210 includes two secondary windings 211 and 212 that are connected in series to form a center tap. The center tap is connected to the housing. Opposite ends of the secondary windings 211 and 212 are connected to anode terminals of the diodes 201 and 202, respectively. Cathode terminals of the diodes 201 and 202 are connected to one end of the capacitor 220 and an output terminal. The other end of the capacitor 220 is connected to the housing.

In this secondary-side circuit of the DC-DC converter, with the transient component of a potential change generated in the secondary winding 211 of the transformer 210, a noise current loop 206 is formed by the parasitic capacitance 204 of the semiconductor module 200 and the parasitic capacitance 205 between the heat spreader 203 and the housing. Since the connection point to the housing varies depending on the method of fixing the semiconductor module 200, the parasitic capacitance 205 causes individual differences in noise characteristics. Further, the transient component of a potential change in the electrode corresponding to the cathode terminals of the diodes 201 and 202 flows through the parasitic capacitance 204 of the semiconductor module 200, the parasitic capacitance 205 between the heat spreader 203 and the housing, the housing, and the capacitor 220. Thus, a noise current loop 207 is formed through which noise generated in the semiconductor module 200 returns to the semiconductor module 200 via the housing and the capacitor 220.

As illustrated in FIG. 11B, a semiconductor module 7 according to the sixth embodiment includes two diodes 71 and 72, and a heat spreader 73. In this semiconductor module 7 as well, a circuit block includes an insulating substrate. A circuit pattern is formed on one surface of the insulating substrate, and the diodes 71 and 72 have cathode terminals soldered to the circuit pattern and thus are mounted thereon. The heat spreader 73 is soldered on the other surface of the insulating substrate. Further, the circuit pattern to which the cathode terminals of the diodes 71 and 72 are connected is electrically connected to the heat spreader 73 via a capacitor 74. This electrical connection is made using one of the methods implemented in the first through fifth embodiments. Further, the electrical connection between the heat spreader 73 and the housing may be reliably made by fixing the semiconductor module 7 to the housing using any one of the methods illustrated in FIG. 10A to 10E. Accordingly, the connection point to the housing does not vary depending on the method of fixing the semiconductor module 7, and therefore the noise current flowing through a noise current loop 75 does not cause individual differences in noise characteristics.

The secondary-side circuit of the DC-DC converter includes a transformer 80 that transforms an AC voltage into a predetermined voltage, the semiconductor module 7 that performs full-wave rectification, and a capacitor 90 that smooths the rectified voltage. The transformer 80 includes two secondary windings 81 and 82 that are connected in series to form a center tap. The center tap is connected to the housing. Opposite ends of the secondary windings 81 and 82 are connected to anode terminals of the diodes 71 and 72, respectively. Cathode terminals of the diodes 71 and 72 are connected to one end of the capacitor 90 and an output terminal. The other end of the capacitor 90 is connected to the housing.

In the semiconductor module 7, the circuit pattern of the cathode terminals of the diodes 71 and 72 is electrically connected to the heat spreader 73 via a capacitor 74. Therefore, the transient component of a potential change in that circuit pattern flows through a minimum noise current loop 77 formed by a parasitic capacitance 76 between the circuit pattern and the heat spreader 73 and the capacitor 74.

The semiconductor module having the configuration described above is advantageous in that since the noise current loop is minimized, it is possible to enhance the noise reduction effect. Further, since the semiconductor module itself has a noise reduction effect, it is possible to easily reduce the size of the inverter device and reduce the noise level without adding or changing any process during assembly.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module, comprising:
   a circuit block including
      an electrically insulating layer having two surfaces,
      a plurality of circuit patterns formed on one surface of the electrically insulating layer, and
      a plurality of power semiconductors mounted on the circuit patterns;
   a heat spreader formed on the other surface of the electrically insulating layer; and
   a capacitor having two electrodes, one of which is electrically connected to at least one of the circuit patterns, and the other of which is electrically connected to the heat spreader via another one of the circuit patterns that is electrically connected to the heat spreader by a conductive pin pressed in the electrically insulating layer.

2. The semiconductor module according to claim 1, wherein the one electrode of the capacitor is connected to one of the circuit patterns to which a maximum potential in the circuit block is applied.

3. The semiconductor module according to claim 1, wherein the one electrode of the capacitor is connected to one of the circuit patterns to which a minimum potential in the circuit block is applied.

4. The semiconductor module according to claim 1, wherein the one electrode of the capacitor is connected to one of the circuit patterns that has a greatest potential change in the circuit block.

5. The semiconductor module according to claim 1, wherein said the other electrode of the capacitor is electrically connected to the heat spreader via one of the circuit patterns that is electrically connected to the heat spreader by a conductive wire extending through an opening provided through the electrically insulating layer.

6. The semiconductor module according to claim 1, wherein said the other electrode of the capacitor is connected to the heat spreader via one of the circuit patterns that is electrically connected to the heat spreader via a conductive screw, which is disposed through the electrically insulating layer and fixes the one circuit pattern to the heat spreader.

7. The semiconductor module according to claim 1, wherein said the other electrode of the capacitor is connected to the heat spreader via one of the circuit patterns that is electrically connected to the heat spreader by a plated through hole provided in the electrically insulating layer and the heat spreader.

8. The semiconductor module according to claim 1, wherein said the other electrode of the capacitor is electrically connected to the heat spreader at a point that is substantially a center of a module outer shape, or substantially a center in one or both of a long-side direction and a short-side direction of the electrically insulating layer.

9. The semiconductor module according to claim 1, further comprising a resin case having a lead frame inserted therein, the electrically insulating layer, the circuit patterns, the power semiconductors, the capacitor and the heat spreader being disposed in the resin case, the lead frame serving as a terminal.

10. The semiconductor module according to claim 9, wherein in the resin case, a space at a side where the circuit patterns, the power semiconductors, and the capacitor are disposed is sealed with resin.

11. The semiconductor module according to claim 1, wherein the heat spreader has an outwardly curved shape with a bulging outer surface.

12. The semiconductor module according to claim 1, wherein the electrically insulating layer is an organic insulating layer.

13. The semiconductor module according to claim 1, wherein the electrically insulating layer is an inorganic insulating layer.

14. The semiconductor module according to claim 1, wherein the circuit patterns are generated by etching a conductive plate or film formed on the one surface of the electrically insulating layer.

15. The semiconductor module according to claim 1, wherein the circuit patterns are generated by applying a conductive plate to the one surface of the electrically insulating layer.

16. The semiconductor module according to claim 1, wherein the heat spreader is made of copper or aluminum.

17. The semiconductor module according to claim 1, wherein the heat spreader includes a conductive plate.

18. The semiconductor module according to claim 1, wherein the conductive pin fits in a hole that penetrates the another one circuit pattern, the electrically insulating layer and the heat spreader.

19. The semiconductor module according to claim 1, further comprising:
a power supply positive terminal;
a power supply negative terminal; and
another capacitor, wherein
the capacitor and the another capacitor are connected in series between the power supply positive terminal and the power supply negative terminal, a common connection point of the capacitor and the another capacitor being electrically connected to the heat spreader.

* * * * *